(12) United States Patent
Ouellette et al.

(10) Patent No.: US 7,251,757 B2
(45) Date of Patent: Jul. 31, 2007

(54) MEMORY TESTING

(75) Inventors: Michael R. Ouellette, Westford, VT (US); Jeremy P. Rowland, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 453 days.

(21) Appl. No.: 10/727,239

(22) Filed: Dec. 2, 2003

(65) Prior Publication Data

US 2005/0120284 A1 Jun. 2, 2005

(51) Int. Cl.
*G11C 29/00* (2006.01)
*G11C 7/00* (2006.01)

(52) U.S. Cl. ........................ 714/718; 365/201
(58) Field of Classification Search ............... 714/710, 714/711, 718, 719, 723; 365/200–201
See application file for complete search history.

(56) References Cited

U.S. PATENT DOCUMENTS

| | | | |
|---|---|---|---|
| 3,838,260 A | 9/1974 | Nelson | |
| 4,982,380 A | 1/1991 | Koike | |
| 5,173,906 A | 12/1992 | Dreibelbis et al. | |
| 5,406,566 A | 4/1995 | Obara | |
| 5,568,437 A | 10/1996 | Jamal | |
| 5,751,641 A | 5/1998 | Petrosino | |
| 5,953,273 A | 9/1999 | Ikegami | |
| 5,982,681 A | 11/1999 | Schwarz | |
| 6,357,027 B1 | 3/2002 | Frankowsky | |
| 6,421,794 B1 | 7/2002 | Chen et al. | |
| 6,530,052 B1 | 3/2003 | Khou et al. | |
| 6,557,130 B1 | 4/2003 | Krasser et al. | |
| 6,928,377 B2 * | 8/2005 | Eustis et al. | 702/118 |

OTHER PUBLICATIONS

Doney et al., RAM Read/Write Controller During Self-Test, Research Disclosure, Aug. 1989, No. 304, copyright—Kenneth Mason Publications Ltd, England, 1 page.

* cited by examiner

*Primary Examiner*—Cynthia Britt
(74) *Attorney, Agent, or Firm*—Schmeiser, Olsen & Watts; William H. Steinberg

(57) ABSTRACT

A structure comprising a memory chip and a tester for testing the memory chip, and a method for operating the structure. The memory chip comprises a BIST (Built-in Self Test) circuit, a plurality of RAMs (Random Access Memories). A first RAM is selected for testing by scanning in a select value into a RAM select register in the BIST. While the BIST performs a first testing pass for the first RAM, the tester collects cycle numbers of the failing cycles. Then, the BIST performs a second testing pass for the first RAM. At each failing cycle identified during the first testing pass, the BIST pauses so that the content of the location of the first RAM associated with the failing cycle and the state of the BIST can be extracted out of the memory chip. The testing procedures for the other RAMs are similar to that of the first RAM.

24 Claims, 2 Drawing Sheets

MEMORY TESTING

BACKGROUND OF THE INVENTION

1. Technical Field

The present invention relates to memory testing, and more specifically, to a memory chip that facilitates memory testing.

2. Related Art

Testing of a memory array in a conventional memory chip using a tester involves running a BIST (Built-In-Self-Test) circuit inside the memory chip through multiple testing passes. For the first testing pass, the tester initializes the BIST and the BIST performs a predetermined sequence of cycles. A cycle may be a write cycle, a read cycle, or a setup cycle. During a write cycle, the BIST writes a test pattern (e.g., all 1s) into a location of the memory array. During a read cycle, the BIST causes the content of a location of the memory array to be read and compared with the expected data. If there is a mismatch, a fail signal is generated to the tester. During a setup cycle, the BIST may do some setup without writing or reading the memory array.

As an example of the testing of the memory array of the conventional memory chip, assume that during the first testing pass, the BIST sequentially and without pause runs from cycle $1d$ ("d" stands for decimal) to cycle $3000d$, in which cycles $1d$-$2000d$ are setup and write cycles, and cycles $2001d$-$3000d$ are read cycles. Assume further that at cycle $2200d$, the read data is not the same as the expected data. As a result, a fail signal is sent to the tester which records the cycle number of the failing cycle (which is $2200d$). Assume further that at cycle $2400d$, the read data is not the same as the expected data. As a result, a fail signal is sent to the tester which records the cycle number of the failing cycle (which is $2400d$).

As a result, the tester has to run the BIST two more testing passes (the second and third testing passes) to collect fail data corresponding to the two failing cycles $2200d$ and $2400d$. More specifically, for the second testing pass, the tester initializes the BIST and the BIST performs the same predetermined sequence of cycles as in the first testing pass except that the BIST stops at cycle $2200d$. Then, the read data is collected from the memory chip by scanning out the entire memory chip.

Then, for the third pass, the tester again initializes the BIST and the BIST performs the same predetermined sequence of cycles as in the first testing pass except that the BIST stops at cycle $2400d$. Then, the read data is collected from the memory chip by scanning out the entire memory chip.

In general, if during the first testing pass, the tester records N failing cycles, the tester has to cause the BIST to run N more passes. It is always desirable to reduce the number of testing passes the BIST needs to run.

Therefore, a design of a novel memory chip is needed that requires fewer BIST testing passes to test the memory chip than in prior art. A method is also needed for testing the novel memory chip.

SUMMARY OF THE INVENTION

The present invention provides a structure comprising a BIST (Built-In-Self-Test) circuit; and a first memory circuit electrically coupled to the BIST circuit, wherein the BIST circuit is configured to perform a first test pass for the first memory circuit to collect the cycle numbers of failing cycles for the first memory circuit in response to the first memory circuit being selected for testing, and wherein, during a second test pass for the first memory circuit performed by the BIST after the first test pass for the first memory circuit, the BIST circuit is configured to collect the contents of the locations in the first memory circuit associated with the failing cycles for the first memory circuit.

The present invention also provides a method for testing a structure, the method comprising the steps of (a) providing in the structure a BIST (Built-In-Self-Test) circuit and a first memory circuit electrically coupled to the BIST circuit; (b) using the BIST circuit to perform a first test pass for the first memory circuit to collect the cycle numbers of failing cycles for the first memory circuit in response to the first memory circuit being selected for testing; and (c) after performing the first test pass for the first memory circuit, using the BIST circuit to perform a second test pass for the first memory circuit to collect the contents of the locations in the first memory circuit associated with the failing cycles for the first memory circuit.

The present invention also provides a method for testing a memory chip, the method comprising the steps of (a) providing in the memory chip a RAM (Random Access Memory) and a BIST (Built-In-Self-Test) circuit; (b) providing a RAM select register in the BIST circuit; (c) scanning in a select value into the RAM select register so as to select the RAM for testing; (d) using the BIST circuit to test the RAM for a first test pass to collect the cycle numbers of failing cycles in response to the RAM being selected for testing; and (e) after testing the RAM for the first test pass, using the BIST circuit to test the RAM for a second test pass, wherein the second test pass comprises the same sequence of cycles as the first test pass, and wherein during the second test pass, the BIST circuit pauses at each failing cycle so that the contents of the locations of the RAM associated with the failing cycles can be extracted out of the memory chip.

The present invention provides structures for a memory chip that requires fewer BIST testing passes to test the memory chip than in prior art.

The present invention also provides methods for such a memory chip.

DETAILED DESCRIPTION OF THE INVENTION

Figure 1:
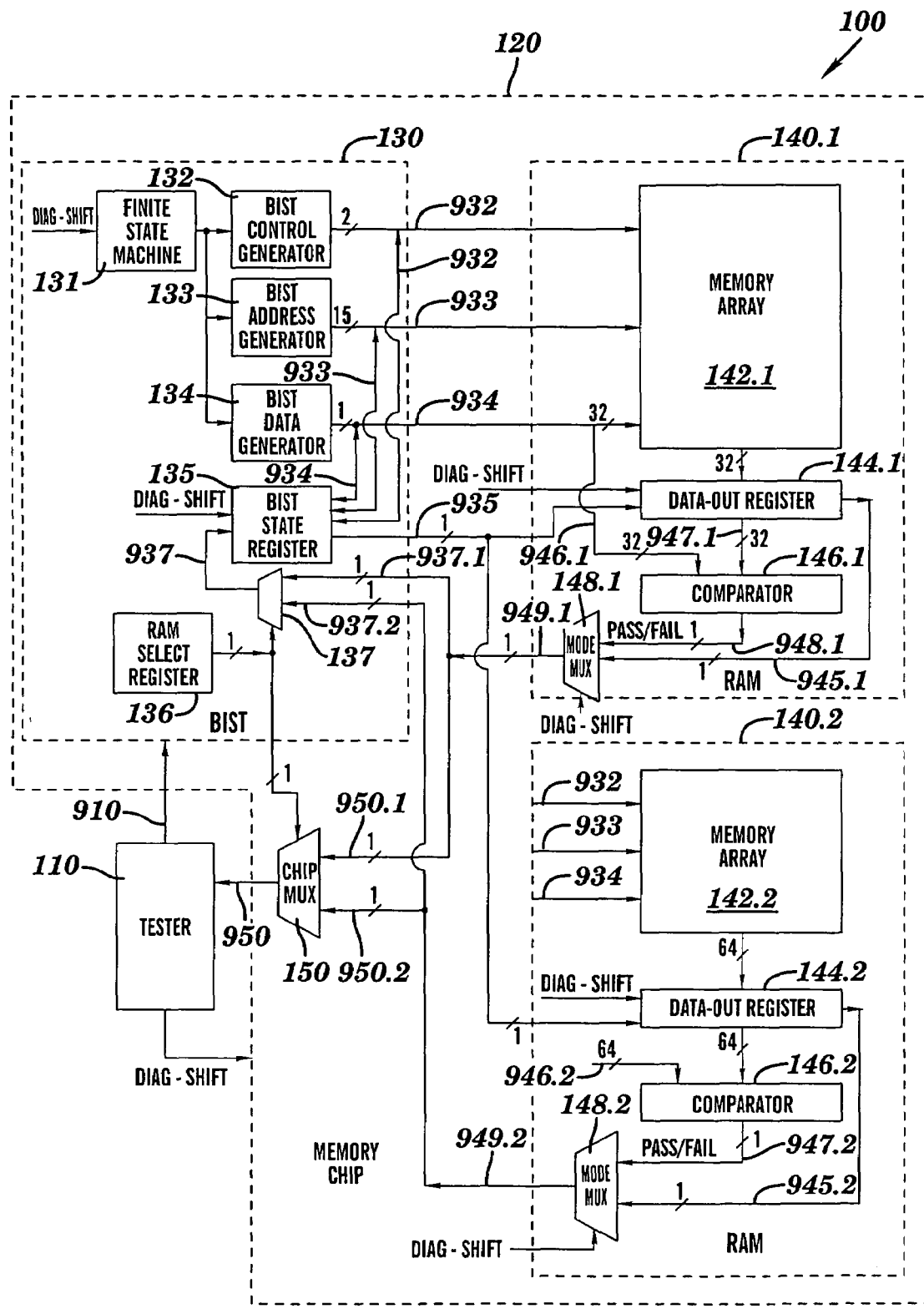
FIG. 1 illustrates a structure comprising a tester and a memory chip, in accordance with embodiments of the present invention.

FIG. 1 illustrates a structure 100 comprising a tester 110 and a memory chip 120, in accordance with embodiments of the present invention. Illustratively, the memory chip 120 comprises a BIST (Built-In-Self-Test) 130, RAM (Random Access Memory) circuits 140.1 and 140.2, and a chip multiplexer 150.

The BIST 130 comprises illustratively a finite state machine 131, a BIST control generator 132, a BIST address generator 133, a BIST data generator 134, a BIST state register 135, a RAM select register 136, and a BIST multiplexer 137.

The RAM 140.1 comprises illustratively a memory array 142.1, a data-out register 144.1, a comparator 146.1, and a mode multiplexer 148.1. Similarly, the RAM 140.2 comprises illustratively a memory array 142.2, a data-out register 144.2, a comparator 146.2, and a mode multiplexer 148.2.

In one embodiment, the BIST 130 can perform a predetermined sequence of cycles including write, read, and setup cycles. During a write cycle, assuming that the RAM 140.1 is being selected for testing, the BIST 130 writes a test pattern into a location of the memory array 142.1. More specifically, during the write cycle, the BIST control generator 132 generates control signals to the memory array 142.1 via connection 932. The control signals indicate to the memory array 142.1 that it is being written.

The BIST address generator 133 generates the address of that write location to the memory array 142.1 via connection 933. The BIST data generator 134 generates a test pattern (e.g., all 0s) to the memory array 142.1 via connection 934. As a result, the test pattern is written to the location of the memory array 142.1.

During a read cycle, assuming that the RAM 140.1 is being selected for testing, the BIST 130 reads out the content of a location of the memory array 142.1 which content is then compared with the expected data so as to detect a fail. More specifically, during the read cycle, the BIST control generator 132 generates control signals to the memory array 142.1 via connection 932. The control signals indicate to the memory array 142.1 that it is being read.

The BIST address generator 133 generates the address of that read location to the memory array 142.1 via connection 933. In response, the memory array 142.1 outputs the content of the read location to the data-out register 144.1 and then to the comparator 146.1 via connections 947.1. The BIST data generator 134 generates the expected pattern/data to the comparator 146.1 via connections 934 and 946.1. The comparator 146.1 compares the read data (on connection 947.1) and the expected data (on connection 946.1). If the two values are not equal, the comparator 146.1 pulls a Pass/Fail signal high on the connection 948.1. In response, the connections 949.1 and 950.1 are also pulled high (explained later). As a result, the connection 950 is also pulled high (explained later) indicating to the tester 110 that the current cycle is a failing cycle.

During a setup cycle, the BIST 130 performs setup within itself without reading from or writing to any RAM 140.1 or 140.2.

Figure 2:
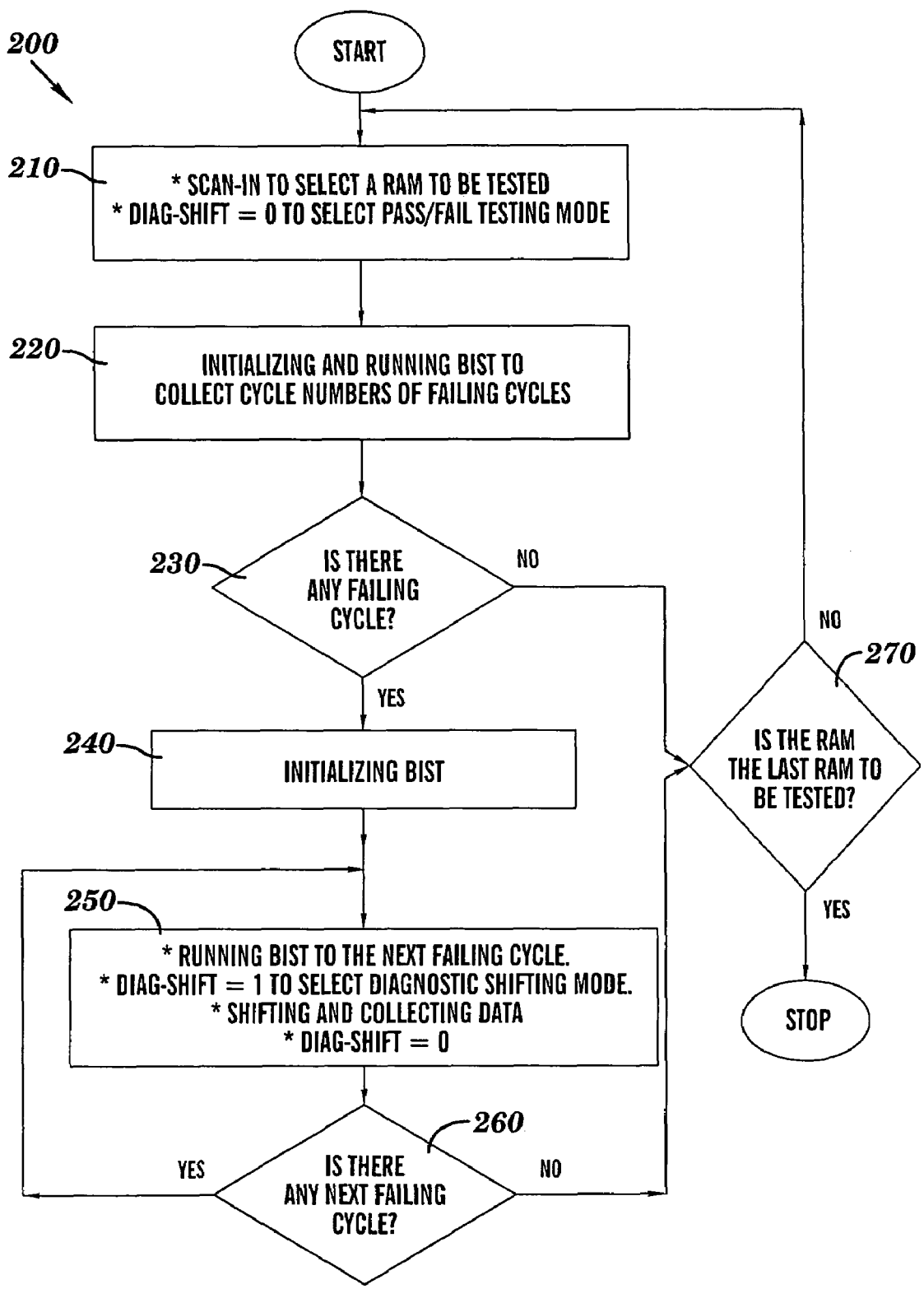
FIG. 2 illustrates the flow chart of a method for operating the structure of FIG. 1.

FIG. 2 illustrates the flow chart of a method 200 for operating the structure of FIG. 1. With reference to both FIGS. 1 and 2, the operation of the structure 100, the connections between the components of the structure 100, and the method 200 will become clear during the discussion of the following example.

In this example, initially, in step 210 of the method 200, a scan-in of the entire memory chip 120 is performed so that the RAM select register 136 contains 0b("b" indicates binary) so as to select the RAM 140.1 for testing. Scan-initialization of other circuits (not shown) causes the chip mux 150 to electrically couple the connections 949.1 and 950.1 (coming from RAM 140.1) to the connection 950 (leading to the tester 110). Multiple BISTs 130 may exist on the chip, and the other chip circuits (not shown) will cause the chip multiplexer to select one of the chip's SRAMs, whereas the BIST multiplexer 137 is used to select one of the SRAMs which share a given BIST.

The RAM select register 136 containing 0b causes the BIST multiplexer 137 to electrically couple the connections 937.1 and 949.1 (coming from RAM 140.1) to the connection 937 (leading to the BIST state register 135). As a result, the RAM 140.1 is selected and ready for testing.

Also in step 210, the tester 110 pulls low a control signal Diag_Shift which is coupled to the BIST state register 135 and the data-out registers 144.1 and 144.2 so that the memory chip 120 is in pass/fail testing mode. In pass/fail testing mode, the BIST 130 tests each location of the RAM 142.1 for defects. If a location of the memory array 142.1 has defective bit(s), the tester 110 is notified via connection 950 as described above related to the read cycle. However, the exact position of the failing bit(s) is not identified. If Diag_Shift=1 (high), the memory chip 120 is in diagnostic shifting mode in which the content of the failing location is shifted out of the memory chip 120 into the tester 110 via connection 950, and the content of the failing location is also restored back to its original location prior to the shift. As a result, the exact position of the failing bit(s) can be identified, and the data out register 144 of the memory 140 can retain its preconditioning value for the next test cycle (more on this later).

In step 220 of the method 200, the tester 110 initializes the BIST 130 via connection 910. After initialization, the BIST 130 performs a predetermined sequence of cycles including setup, write, and read cycles so that all locations of the memory array 142.1 are tested.

Assume for this example that in order to completely test all locations of the memory array 142.1, the BIST 130 has to perform 3000$d$ cycles with cycles 1$d$-2000$d$ being setup and write cycles and cycles 2001$d$-3000$d$ being read cycles. The BIST 130 performs these 3000$d$ cycles sequentially (one cycle at a time) and without pause to completion. This is considered the first testing pass of the testing of the RAM 140.1. The tester 110 will store the failing cycle numbers in tester memory (not shown), for use later.

Assume further for this example that, read cycles 2200$d$ and 2400$d$ are the only two failing cycles identified during the first testing pass. It should be noted that only read cycles can fail. As a result, the tester 110 receives two positive pulses on connection 950 corresponding to cycles 2200$d$ and 2400$d$.

More specifically, during failing read cycle 2200$d$, the comparator 146.1 pulls connection 948.1 high. With Diag_Shift being low (as a result of step 210), the mode mux 148.1 electrically couples the connection 948.1 to the connections 949.1 and 950. As a result, the connections 949.1 and 950 are also pulled high. With RAM 140.1 being selected for testing (as a result of the scan-in process of step 210), the chip mux 150 electrically couples the connection 950.1 to connection 950. As a result, the connection 950 is also pulled high indicating to the tester 110 that the current cycle (cycle 2200$d$) is failing. Failing read cycle 2400$d$ has the same effect as failing read cycle 2200$d$.

In step 230, the tester 110 determines whether there is any failing cycle identified during the first testing pass. Because there are two failing cycles 2200$d$ and 2400$d$ stored in tester memory (not shown), the answer is affirmative. As a result, the method 200 goes to step 240 in which the tester 110 scan-initializes the BIST 130 using the chip's test mode scan chains for a second/final testing pass.

In step 250, the BIST performs the same predetermined sequence of cycles as in the first testing pass described in step 220, except that the BIST 130 stops (pauses) at the next failing cycle which is cycle 2200$d$. Then, the tester 110 pulls Diag_Shift high to select diagnostic shifting mode. In one embodiment, as a result of Diag_Shift being high, the BIST state register 135 in the BIST 130 and the data-out register 142.1 in the RAM 140.1 become shift registers. Also as a result of Diag_Shift being high, the mode mux 148.1 electrically couples connection 945.1 (coming from data-out register 144.1) to connections 949.1 and 937.1. With RAM select register 136 containing 0b so as to select RAM 140.1 for testing, the BIST mux 137 electrically couples connection 937.1 to connection 937 (leading to the BIST state register 135). As a result, a diagnostic shifting loop is formed comprising (in the shifting direction) the BIST state register 135, connection 935, data-out register 144.1, connection 945.1, connection 949.1, connection 937.1, connection 937, and back to the BIST state register 135. In addition, as a result of Diag_Shift being high, the BIST 130's finite state machine 131 is paused so as to temporarily prevent further test cycles from being invoked.

While the content of the diagnostic shifting loop (i.e., the data-out register 144.1 and the content of the BIST state register 135) is shifted/rotated in the diagnostic shifting loop, the loop content can be extracted out to the tester 110 via connections 950.1 and 950. More specifically, assume that the outputs of the BIST control generator 132, the BIST address generator 133, and the BIST data generator 134 have 2 bits, 15 bits, and 1 bit, respectively, and that the values of these bits are needed for the BIST 130 to resume where it pauses. As a result, the BIST state register 135 need to have 18 bits (2+15+1) for receiving (via connections 932, 933, and 934) and storing the values of the outputs of the BIST control generator 132, the BIST address generator 133, and the BIST data generator 134, respectively.

Assume further that the memory array 142.1 is 32 bits wide. As a result, the data-out register 144.1 has 32 bits. In one embodiment, in response to Diag_Shift being pulled high by the tester 110, the BIST state register 135 and the data-out register 144.1 shift their contents around the diagnostic shifting loop (clockwise). At the same time, the contents of the data-out register 144.1 and the content of the BIST state register 135 are also extracted to the tester 110 via connection 950.1 and 950. After pulling high Diag_Shift for 50 clocks (32+18), the tester 110 pulls Diag_Shift low to switch to pass/fail testing mode. As a result, the BIST state register 135 and the data-out register 144.1 have the same contents as before the shift.

With BIST state register 135 having the same content as before the shift, the BIST 130 can resume from where it pauses. In response to Diag_Shift being pulled low, the BIST resumes where it pauses and moves on to the next cycle (i.e., cycle 2201*d*).

With the data-out register 144.1 having the same content as before the shift, the testing sequence is not disturbed. More specifically, the pre-conditioning of the content of the data-out register 144.1 such that defect(s) in the next read cycle (if any) can be identified is preserved.

After the shift, in step 260, the tester 110 determines whether there is any next failing cycle identified during the first testing pass (i.e., Step 220) and stored in tester memory. Because there is another failing cycle which is cycle 2400*d*, the method 200 loops back to step 250. In step 250, the BIST 130 resumes and runs to the next failing cycle which is cycle 2400*d* and pauses there. Then, the tester 110 pulls Diag_Shift high to select diagnostic shifting mode. In response, the BIST state register 135 and the data-out register 144.1 shift their contents around the diagnostic shifting loop (clockwise). At the same time, the contents of the data-out register 144.1 and the content of the BIST state register 135 are also extracted to the tester 110 via connection 950.1 and 950. After pulling high Diag_Shift for 50 clocks (32+18), the tester 110 pulls Diag_Shift low to switch to pass/fail testing mode. As a result, the BIST state register 135 and the data-out register 144.1 have the same contents as before the shift.

After the shift, in step 260, the tester 110 determines whether there is any next failing cycle identified during the first testing pass. Because there is no other failing cycle, the method 200 goes to step 270 in which the tester 110 determines whether the RAM being tested (RAM 140.1) is the last one. Because there is another RAM to be tested (RAM 140.2), the answer is negative. As a result, the method 200 loops back to step 210.

In step 210, a scan-in of the entire memory chip 120 is performed so that the RAM select register 136 contains 1*b* (binary) so as to select the RAM 140.2 for testing. Scan-initialization of other circuits (not shown) causes the chip mux 150 to electrically couple the connections 949.2 and 950.2 (coming from RAM 140.2) to the connection 950 (coming to the tester 110).

The RAM select register 136 containing 1b causes the BIST mux 137 to electrically couple the connections 937.2 and 949.2 (coming from RAM 140.2) to the connection 937 (leading to the BIST state register 135). As a result, the RAM 140.2 is selected and ready for testing.

The testing of the RAM 140.2 is similar to that of the RAM 140.1. More specifically, the diagnostic shifting loop now comprises (in the shifting direction) the BIST state register 135, connection 935, data-out register 144.2, connection 945.2, connection 949.2, connection 937.2, connection 937, and back to the BIST state register 135.

Assume further that the memory array 142.2 is 64 bits wide. As a result, the data-out register 144.2 has 64 bits. As a result, the tester 110 needs to shift the diagnostic shifting loop 82 times (64+18) so as to obtain the contents of the data-out register 144.2 and the BIST state register 135 and so that the data-out register 144.2 and the BIST state register 135 have the same contents as before the shift. Furthermore, at completion of the shift, the BIST 130's finite state machine 131 will resume from the temporarily paused last state before the shift.

After the data associated with the last failing cycle is collected, the method 200 goes to step 270 where the tester 110 determines whether the RAM being tested (RAM 140.2) is the last one. Because the RAM 140.2 is the last one to be tested, the answer is affirmative. As a result, the method 200 stops.

With the contents of the failing locations of the RAMs 140.1 and 140.2 collected by the tester 110, analysis can be done to identify the exact positions of the failing bits of these locations.

In FIG. 2, for simplicity, some existing connections are not shown. For instance, the connections 932, 933, and 934 from the BIST control generator 132, the BIST address generator 133, and the BIST data generator 134, respectively, are also connected (but not shown) to the memory array 142.2. The connection 934 from the BIST data generator 134 is also connected (but not shown) to the comparator 146.2 via connection 946.2.

In summary, for each RAM 140.1, the BIST 130 runs only two passes. During the first testing pass, the BIST 130 sequentially and without pause runs through a predetermined sequence of cycles while the tester 110 collects the cycle numbers of the failing cycles.

During the second/last testing pass, the BIST 130 sequentially runs through the same cycles as in the first testing pass, but pauses at each failing cycle identified in the first testing pass so that the tester 110 can collects the content of the location associated with the failing cycle. In the example above, for the RAM 140.1, there are two failing cycles 2200*d* and 2400*d* identified during the first testing pass. As a result, during the second testing pass, the BIST 130 pauses a first time for 50 clocks for the tester 110 to collect the content of the location associated with the failing cycle 2200*d*, and pauses a second time for 50 clocks for the tester 110 to collect the content of the location associated with the failing cycle 2400*d*. In general, for the RAM 140.1, if M (a positive integer) failing cycles are identified during the first testing pass, then during the second testing pass, the BIST 130 pauses M times for 50 clocks per pause. As a result, a lot of tester time is saved compared with the case of prior art where the BIST has to restart from cycle 1 (as opposed to resuming) after the content of the location associated with each failing cycle is collected by scanning-out the entire the memory chip.

In the embodiments described above, the memory chip 120 (FIG. 1) has only two RAMs 140.1 and 140.2. In general, the memory chip 120 can have any number of RAMs. For example, assume the memory chip 120 has $2^N$ RAMS (N is a positive integer). As a result, the RAM select mux 137 needs to have $2^N$ inputs, the chip mux 150 needs to have $2^N$ inputs, and the RAM select register 136 needs to have N bits. Alternately, a chip could contain P BISTs 130, whereby not all SRAMs share the same BIST 130, and the number of SRAMs sharing a BIST 130 is less than N, in which case, the BIST multiplexer 137 would need to have less than N inputs. In this case however, the chip mux 150 would still require N inputs (one for each SRAM on the chip).

In the embodiments described above, the BIST state register 135 has 18 bits. In general, the BIST state register 135 can have any number of bits depending on how many bits of the outputs of the BIST control generator 132, the BIST address generator 133, and the BIST data generator 134 need to be saved so that the BIST 130 can resume later.

In the embodiments described above, the RAM 140.1 and 140.2 are 32 bits and 64 bits wide. In general, a RAM 140.1 can be K bits wide (K is positive integer). Then, if the BIST state register 135 has L bits (L is positive integer), the associated loop needs to be shifted K+L times at a pause.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A structure, comprising:
   a BIST (Built-In-Self-Test) circuit; and
   a first memory circuit electrically coupled to the BIST circuit, wherein the BIST circuit is configured to perform a first test pass for the first memory circuit to collect the cycle numbers of failing cycles for the first memory circuit in response to the first memory circuit being selected for testing, and wherein, during a second test pass for the first memory circuit performed by the BIST after the first test pass for the first memory circuit, the BIST circuit is configured to collect the contents of the locations in the first memory circuit associated with the failing cycles for the first memory circuit.

2. The structure of claim 1, wherein the BIST circuit further comprises a memory circuit select register configured to receive a select value via scanning such that the first memory circuit is selected for testing.

3. The structure of claim 1, wherein the first memory circuit comprises a first data-out register configured to store a content of a location of the first memory circuit associated with a current cycle, wherein the BIST circuit comprises a BIST state register configured to store BIST control, address, and data signals of the current cycle, and wherein during a failing cycle of the second test pass for the first memory circuit, (i) the BIST circuit is configured to pause, (ii) the first data-out register and the BIST state register are electrically coupled together so as to form a first diagnostic shifting loop, and (iii) the contents of the first data-out register and the BIST state register are shifted in the first diagnostic shifting loop such that the contents of the first data-out register and the BIST state register can be extracted out of the structure, and such that, after the shift, the first data-out register and the BIST state register have the same contents as before the shift.

4. The structure of claim 3, wherein the BIST circuit further comprises a BIST multiplexer configured to electrically couple the first data-out register and the BIST state register together so as to form the first diagnostic shifting loop during a failing cycle of the second test pass for the first memory circuit and in response to the first memory circuit being selected for testing.

5. The structure of claim 3, further comprising a chip multiplexer configured to electrically couple the first data-out register to a tester during a failing cycle of the second test pass for the first memory circuit and in response to the first memory circuit being selected for testing, wherein the contents of the first data-out register and the BIST state register are extracted to the tester via the chip multiplexer in response to the contents of the first data-out register and the BIST state register being shifted in the first diagnostic shifting loop.

6. The structure of claim 5, wherein the first memory circuit further comprises:
   a first comparator electrically coupled to the first data-out register and the BIST circuit; and
   a first mode multiplexer electrically coupled to the first comparator and the first data-out register,
   wherein in response to the BIST circuit executing a cycle which is not a failing cycle of the second testing pass for the first memory circuit, the first mode multiplexer is configured to electrically couple the first comparator to the chip multiplexer, and wherein in response to the BIST circuit executing a failing cycle of the second testing pass for the first memory circuit, the first mode multiplexer is configured to electrically couple the first data-out register to the chip multiplexer.

7. The structure of claim 3, further comprising a second memory circuit electrically coupled to the BIST circuit, wherein the BIST circuit is configured to perform a first test pass for the second memory circuit to collect the cycle numbers of failing cycles for the second memory circuit in response to the second memory circuit being selected for testing, and wherein, during a second test pass for the second memory circuit performed by the BIST after the first test pass for the second memory circuit, the BIST circuit is configured to collect the contents of the locations of the second memory circuit associated with the failing cycles for the second memory circuit.

8. The structure of claim 7, wherein the second memory circuit comprises a second data-out register configured to store a content of a location of the second memory circuit associated with a current cycle, and wherein during a failing cycle of the second test pass for the second memory circuit, (i) the BIST circuit is configured to pause, (ii) the second data-out register and the BIST state register are electrically coupled together so as to form a second diagnostic shifting loop, and (iii) the contents of the second data-out register and the BIST state register are shifted in the second diagnostic shifting loop such that the contents of the second data-out register and the BIST state register can be extracted out of the structure, and such that the second data-out register and the BIST state register have the same contents as before the shift.

9. The structure of claim 1, wherein the first test pass comprises a plurality of cycles such that each cycle of the plurality of cycles is selected from the group consisting of a read cycle, a write cycle, and a setup cycle, wherein the setup cycle is within the BIST and does not include reading from or writing to any random access memory (RAM), and wherein the second test pass comprises said plurality of cycles.

10. The structure of claim 9, wherein a first cycle of the plurality of cycles includes the setup cycle.

11. A method for testing a structure, the method comprising the steps of:
providing in the structure a BIST (Built-In-Self-Test) circuit and a first memory circuit electrically coupled to the BIST circuit;
using the BIST circuit to perform a first test pass for the first memory circuit to collect the cycle numbers of failing cycles for the first memory circuit in response to the first memory circuit being selected for testing; and
after performing the first test pass for the first memory circuit, using the BIST circuit to perform a second test pass for the first memory circuit to collect the contents of the locations in the first memory circuit associated with the failing cycles for the first memory circuit.

12. The method of claim 11, further comprising the step of using a memory circuit select register to receive a select value via scanning so as to select the first memory circuit for testing.

13. The method of claim 11, further comprising steps of:
providing in the first memory circuit a first data-out register configured to store a content of a location of the first memory circuit associated with a current cycle;
providing in the BIST circuit a BIST state register configured to store BIST control, address, and data signals of the current cycle; and
during a failing cycle of the second test pass for the first memory circuit, (i) pausing the BIST circuit, (ii) electrically coupling the first data-out register and the BIST state register together so as to form a first diagnostic shifting ioop, (iii) shifting the contents of the first data-out register and the BIST state register in the first diagnostic shifting loop such that the first data-out register and the BIST state register have the same contents as before the shift, and (iv) extracting the contents of the first data-out register and the BIST state register from the first diagnostic shifting loop out of the structure during the shift.

14. The method of claim 13, further comprising the step of using a BIST multiplexer in the BIST circuit to electrically couple the first data-out register and the BIST state register together so as to form the first diagnostic shifting loop during a failing cycle of the second test pass for the first memory circuit and in response to the first memory circuit being selected for testing.

15. The method of claim 13, further comprising the steps of:
using a chip multiplexer to electrically couple the first data-out register to a tester during a failing cycle of the second test pass for the first memory circuit and in response to the first memory circuit being selected for testing; and
extracting the contents of the first data-out register and the BIST state register to the tester via the chip multiplexer in response to the contents of the first data-out register and the BIST istate register being shifted in the first diagnostic shifting ioop.

16. The method of claim 15, further comprising the steps of:
providing a first comparator electrically coupled to the first data-out register and the BIST circuit;
providing a first mode multiplexer electrically coupled to the first comparator and the first data-out register;
using the first mode multiplexer to electrically couple the first comparator to the chip multiplexer in response to the BIST circuit executing a cycle which is not a failing cycle of the second testing pass for the first memory circuit; and
using the first mode multiplexer to electrically couple the first data-out register to the chip multiplexer in response to the BIST circuit executing a failing cycle of the second testing pass for the first memory circuit.

17. The method of claim 11 wherein the first test pass comprises a plurality of cycles such that each cycle of the plurality of cycles is selected from the group consisting of a read cycle, a write cycle, and a setup cycle, wherein the setup cycle is within the BIST and does not include reading from or writing to any random access memory (RAM), and wherein the second test pass comprises said plurality of cycles.

18. The method of claim 17, wherein a first cycle of the plurality of cycles includes the setup cycle.

19. The method of claim 13, further comprising the steps of:
providing in the structure a second memory circuit electrically coupled to the BIST circuit;
using the BIST circuit to perform a first test pass for the second memory circuit to collect the cycle numbers of failing cycles for the second memory circuit in response to the second memory circuit being selected for testing; and
after performing the first test pass for the second memory circuit, using the BIST circuit to perform a second test pass for the second memory circuit to collect the contents of the locations in the second memory circuit associated with the failing cycles for the second memory circuit.

20. The method of claim 19, further comprising the steps of:
providing in the second memory circuit a second data-out register configured to store a content of a location of the second memory circuit associated with a current cycle; and
during a failing cycle of the second test pass for the second memory circuit, (i) pausing the BIST circuit, (ii) electrically coupling the second data-out register and the BIST state register together so as to form a second diagnostic shifting loop, (iii) shifting the contents of the second data-out register and the BIST state register in the second diagnostic shifting loop such that the second data-out register and the BIST state register have the same contents as before the shift, and (iv) extracting the contents of the second data-out register and the BIST state register from the second diagnostic shifting loop out of the structure during the shift.

21. A method for testing a memory chip, the method comprising the steps of:
providing in the memory chip a RAM (Random Access Memory) and a BIST (Built-In-Self-Test) circuit;
providing a RAM select register in the BIST circuit;

scanning in a select value into the RAM select register so as to select the RAM for testing;

using the BIST circuit to test the RAM for a first test pass to collect the cycle numbers of failing cycles in response to the RAM being selected for testing; and after testing the RAM for the first test pass, using the BIST circuit to test the RAM for a second test pass, wherein the second test pass comprises the same sequence of cycles as the first test pass, and wherein during the second test pass, the BIST circuit pauses at each failing cycle so that the contents of the locations of the RAIVI associated with the failing cycles can be extracted out of the memory chip.

22. The method of claim 21, wherein the step of using the BIST circuit to test the RAM for the first test pass to collect the cycle numbers of the failing cycles in response to the PAM being selected for testing comprises the steps of, for each cycle of the first test pass:

using a data-out register in the RAM to store the content of a location in the RAM associated with the cycle;

using a comparator in the RAM to compare the content of the data-out register and an expected value from the BIST circuit and to generate a fail signal if the content of the data-out register and the expected value are not equal;

using a mode multiplexer to pass the fail signal from the comparator to a chip multiplexer; and using the chip multiplexer to pass the fail signal from the mode multiplexer to a tester outside the memory chip.

23. The method of claim 22, wherein the step of using the BIST circuit to test the RAM for the second test pass comprises the steps of, during each failing cycle:

pausing the BIST circuit;

forming a diagnostic shifting loop comprising a BIST state register in the BIST circuit, the data-out register, the mode multiplexer, and the RAIVI select register, wherein the BIST state register stores the BIST control, address, and data signals associated with the current failing cycle;

shifting the contents of the BIST state register and the data-out register in the diagnostic shifting loop; and extracting the contents of the BIST state register and the data-out register from the diagnostic shifting loop to the tester via the BIST multiplexer and chip multiplexer.

24. The method of claim 23, wherein the step of forming the diagnostic shifting loop comprises the steps of:

using the tester to generate a diagnostic shifting signal to the BIST state register and the data-out register so as to switch them to shift registers; and using the mode multiplexer to electrically couple the data-out register to the BIST state register in response to the diagnostic shifting signal being generated; and using the tester to generate a diagnostic shifting signal to the BIST finite state machine so as to cause the finite state machine to be temporarily paused so that it holds it's current state, while shifting the data in the diagnostics shifting ioop.

* * * * *